(12) United States Patent
Byun

(10) Patent No.: US 9,484,375 B2
(45) Date of Patent: Nov. 1, 2016

(54) IMAGE SENSOR WITH 3D STACK STRUCTURE

(71) Applicant: SILICONFILE TECHNOLOGIES INC., Seongnam-si, Gyeonggi-do (KR)

(72) Inventor: Kyung Su Byun, Cheongju-si (KR)

(73) Assignee: SiliconFile Technologies Inc., Gyeonggi-do (KR)

( * ) Notice: Subject to any disclaimer, the term of this patent is extended or adjusted under 35 U.S.C. 154(b) by 264 days.

(21) Appl. No.: 14/466,258

(22) Filed: Aug. 22, 2014

(65) Prior Publication Data

US 2015/0053846 A1 Feb. 26, 2015

(30) Foreign Application Priority Data

Aug. 22, 2013 (KR) .................. 10-2013-0099670

(51) Int. Cl.
*H01L 27/146* (2006.01)
(52) U.S. Cl.
CPC ..... *H01L 27/14629* (2013.01); *H01L 27/1469* (2013.01); *H01L 27/14634* (2013.01); *H01L 27/14647* (2013.01)
(58) Field of Classification Search
CPC .................. H01L 27/14629; H01L 27/14634; H01L 27/14647; H01L 27/1469
USPC ................ 250/208.1; 257/290–294
See application file for complete search history.

(56) References Cited

U.S. PATENT DOCUMENTS

| 2010/0157117 A1* | 6/2010 | Wang ............... H01L 27/14621 348/276 |
| 2010/0193848 A1* | 8/2010 | Lee .................. H01L 27/14667 257/294 |
| 2015/0122971 A1* | 5/2015 | He ....................... H04N 5/3745 250/208.1 |

FOREIGN PATENT DOCUMENTS

| JP | 2010-212668 | 9/2010 |
| KR | 10-2007-0070453 | 7/2007 |
| KR | 10-2010-0036714 | 4/2010 |
| KR | 10-2011-0091310 | 8/2011 |
| KR | 10-2011-0136207 | 12/2011 |
| KR | 10-2013-0012952 | 2/2013 |
| KR | 10-2013-0016518 | 2/2013 |
| KR | 10-1290033 | 7/2013 |

* cited by examiner

*Primary Examiner* — Seung C Sohn
(74) *Attorney, Agent, or Firm* — IP & T Group LLP

(57) ABSTRACT

Disclosed is an image sensor with a 3D stack structure, in which pixels of a top plate are realized as image pixels and pixels of a bottom plate are realized as pixels for realizing a phase difference AF, so that the phase difference AF is realized without loss of resolution. In the image sensor with a 3D stack structure, a problem of the reduction of resolution, which is a disadvantage of an existing imaging surface phase difference AF device, is solved, so that a fast phase difference AF is realized while maintaining high resolution without a separate phase difference AF module.

13 Claims, 8 Drawing Sheets

IMAGE SENSOR WITH 3D STACK STRUCTURE

BACKGROUND OF THE INVENTION

1. Field of the Invention

The present invention relates to an image sensor, and more particularly, to an image sensor with a 3D stack structure, in which pixels of a top plate are realized as image pixels and pixels of a bottom plate are realized as pixels for realizing a phase difference AF, so that the phase difference AF can be realized without loss of resolution.

2. Description of the Related Art

Recently, so-called electronic cameras are widely spread. The electronic camera operates through a process in which when an object is captured through an optical system, an image is formed on an image sensor that is a semiconductor imaging device, the image of the object is converted into an electrical signal, and image data of the obtained still image is recorded on a recording medium such as a semiconductor memory or a magnetic disk.

Most electronic cameras are provided with an auto-focus (hereinafter, referred to as 'AF') device that controls capturing conditions in order to automatically focus an image of an object. Among conventional methods for obtaining such auto-focusing, a technology called a phase difference AF is widely used.

In the phase difference AF, since it is possible to immediately recognize a distance between an in-focus point and a film surface based on an inter-image distance (a phase difference) when light from an image of an object is received in a phase difference detection sensor provided with a CCD line sensor, it is mainly used in that it is possible to allow the in-focus point to coincide with the film surface through one-time driving.

In a structure of a conventional imaging surface phase difference AF, a specific number of pixels in a pixel array of a sensor are artificially blocked or a photodiode is allowed to move, so that phase information is obtained.

The structure of the imaging surface phase difference AF includes a first element having a pixel function for realizing an image and a second element for realizing a phase difference AF function. In this case, the second element is obtained by performing special processing for the first element and is provided as a plurality of pairs.

Due to such a structure, even though there is no separate phase difference AF sensor module, since it is possible to realize the phase difference AF function through only a sensor itself, it is possible to use a fast phase difference AF in compact digital cameras.

However, when the phase difference AF is realized on the sensor surface, since pixels to be used for forming an image are lost, overall resolution is reduced. That is, in the structure of the conventional imaging surface phase difference AF, there is a problem that in order to improve resolution, it is difficult to realize the phase difference AF, and in order to realize precise phase difference AF, resolution is reduced.

SUMMARY OF THE INVENTION

Accordingly, the present invention has been made in an effort to solve the problems occurring in the related art, and an object of the present invention is to provide an image sensor with a 3D stack structure, which can realize a fast phase difference AF while maintaining high resolution without loss of resolution even though there is no separate phase difference AF module.

In order to achieve the above object, according to one aspect of the present invention, there is provided an image sensor with a 3D stack structure including: a first substrate including a first photodiode; and a second substrate including a second photodiode and stacked at an upper portion of the first substrate, wherein a part of light incident into the first photodiode is blocked to realize a phase difference AF function.

In the image sensor with a 3D stack structure according to the present invention, preferably, a size of the first photodiode is smaller than a size of the second photodiode.

Preferably, a metal interconnection formed at an upper portion of the first photodiode is lengthened to block the incidence of light to a part of the first photodiode.

A blocking layer may be formed on a bonding surface between the first substrate and the second substrate such that light is prevented from being incident into a part of the first photodiode.

Preferably, a light waveguide is formed at an upper portion of a part at which light is incident into the first photodiode, so that light is more sensitively transferred to the first photodiode.

Preferably, a Talbot effect induction filter is provided at an upper portion of the first photodiode.

In accordance with an image sensor with a 3D stack structure according to the present invention, it is possible to realize a phase difference AF without loss of resolution.

Furthermore, as well as the realization of a phase difference AF function, it is possible to measure a distance between objects by modifying a structure of a bottom plate and to capture a three dimensional image.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
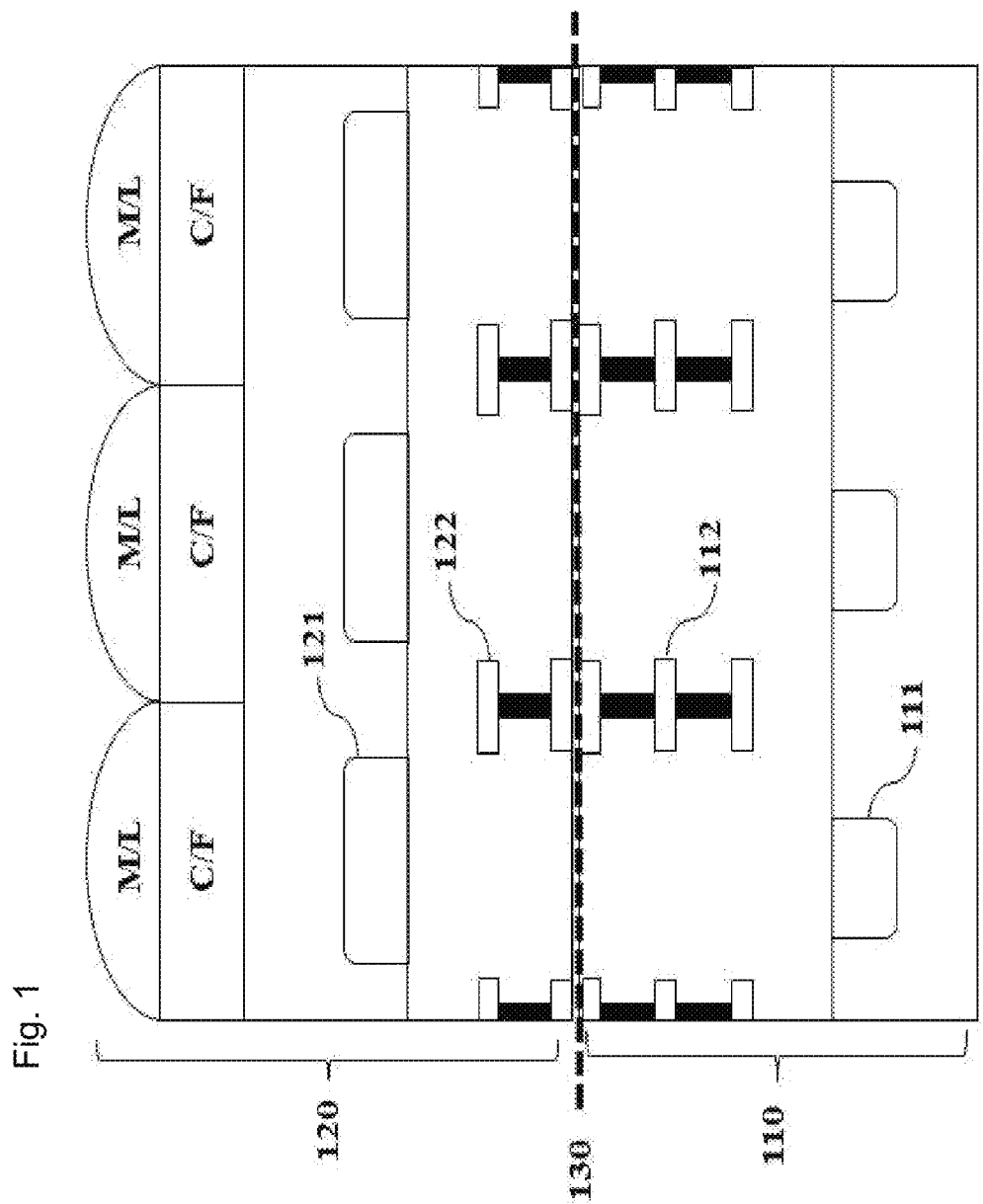
FIG. 1 is a diagram illustrating an embodiment of an image sensor with a 3D stack structure according to the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

The present invention is characterized in that in an image sensor with a 3D stack structure, different types of phase information generated when light having passed through a top plate is blocked by an artificial structure of a photodiode of a bottom plate is added to realize a phase difference AF.

FIG. 1 is a diagram illustrating an embodiment of an image sensor with a 3D stack structure according to the present invention.

Referring to FIG. 1, the image sensor with a 3D stack structure has a stack structure of a first substrate 110 and a second substrate 120, wherein the first substrate 110 includes a first photodiode 111 and the second substrate 120 includes a second photodiode 121.

In a first embodiment for realizing a phase difference AF function, as illustrated in FIG. 1, a size of the first photodiode 111 formed in the first substrate 110 is smaller than a size of the second photodiode 121 formed in the second substrate 120.

When the size of the first photodiode 111 is smaller than the size of the second photodiode 121, light incident into the first photodiode 111 is reduced, and different types of phase information generated due to the reduction of the light is added to realize the phase difference AF function.

Referring to FIG. 1, it can be understood that color filters (C/Fs) and microlenses (M/Ls) are formed at an upper portion of the second substrate 120. Since such color filters and microlenses are a general technology of an image sensor, a detailed description thereof will be omitted.

Figure 2:
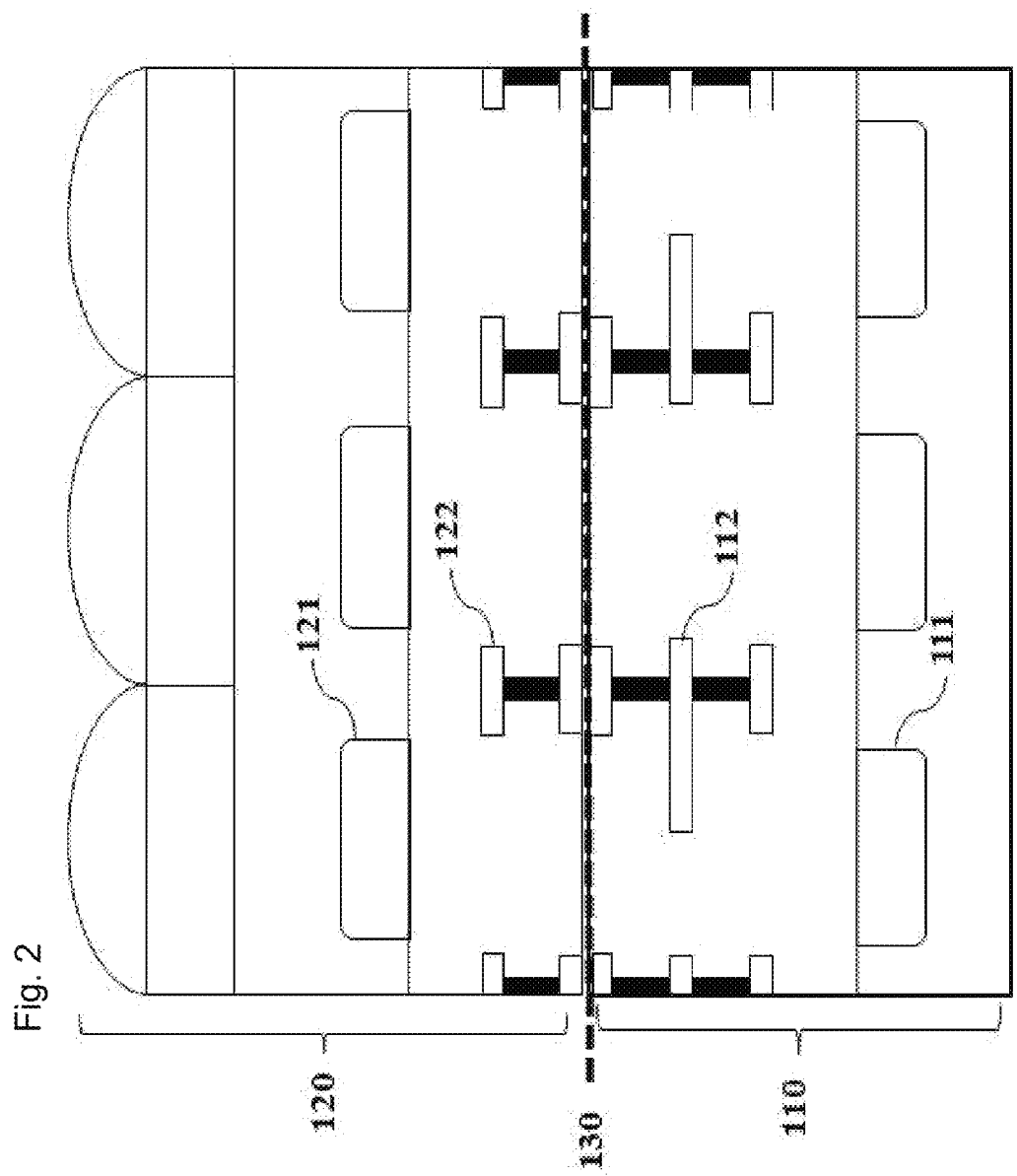
FIG. 2 is a diagram illustrating another embodiment of an image sensor with a 3D stack structure according to the present invention.

FIG. 2 is a diagram illustrating another embodiment of the image sensor with a 3D stack structure according to the present invention.

Referring to FIG. 2, the image sensor with a 3D stack structure according to the present invention has a stack structure of the first substrate 110 and the second substrate 120, wherein the first substrate 110 includes the first photodiode 111 and the second substrate 120 includes the second photodiode 121.

The second substrate 120 (a top plate) is used to form an image and the first substrate 110 (a bottom plate) is used to realize the phase difference AF function.

FIG. 2 is another embodiment for realizing the phase difference AF function, and illustrates that metal interconnections 112 in the image sensor of the first substrate 110 (the bottom plate) are lengthened to obtain an effect of artificially blocking light incident into the first photodiode 111. The metal interconnection 112 in any positions of the first substrate 110 may be used.

Figure 3:
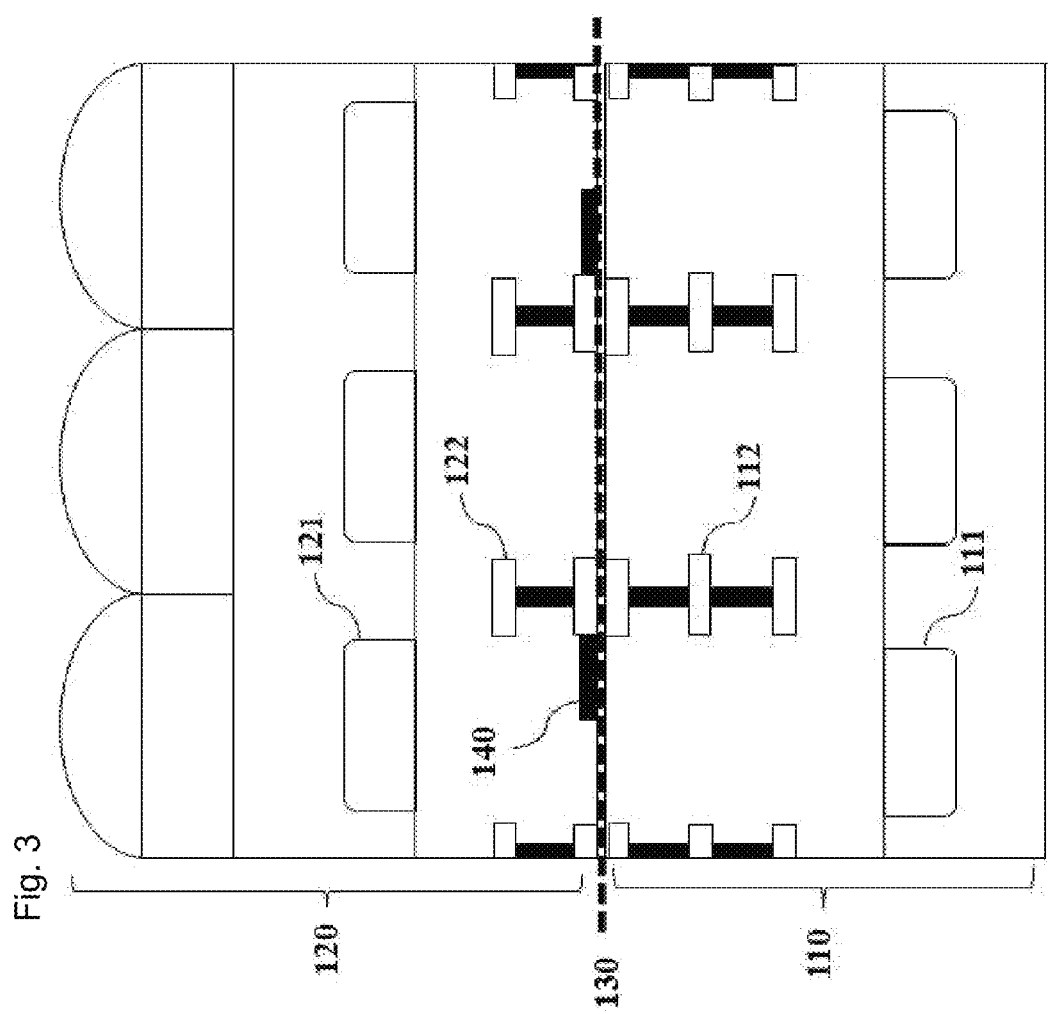
FIG. 3 is a diagram illustrating another embodiment of an image sensor with a 3D stack structure according to the present invention.
Figure 4:
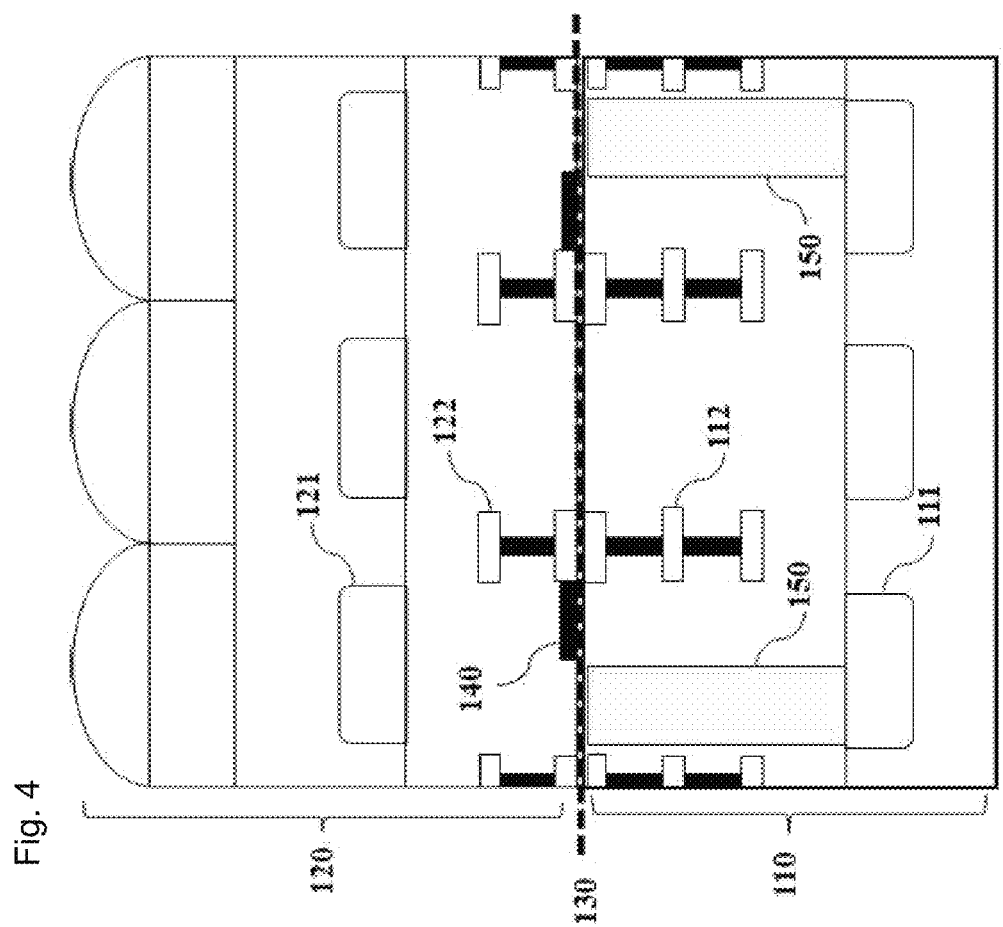
FIG. 4 is a diagram illustrating further another embodiment of an image sensor with a 3D stack structure according to the present invention.

FIG. 3 and FIG. 4 are diagrams illustrating other embodiments of the image sensor with a 3D stack structure according to the present invention.

Referring to FIG. 3, the image sensor with a 3D stack structure according to the present invention has a stack structure of the second substrate 120 used to form an image and the first substrate 110 used to realize the phase difference AF function.

The first substrate 110 includes the first photodiode 111 and the second substrate 120 includes the second photodiode 121.

Referring to FIG. 3, it can be understood that in order to realize the phase difference AF function, a blocking layer 140 is formed on a bonding surface 130 of the first substrate 110 and the second substrate 120 to partially block the incidence of light to the first photodiode 111.

A material of the blocking layer 140 performs a function of absorbing incident light, and may include various materials in addition to a black material.

As illustrated in FIG. 4, preferably, a light waveguide 150 is provided in a part with no blocking layer 140 to allow light to be more sensitively transferred to the first photodiode 111.

Figure 5:
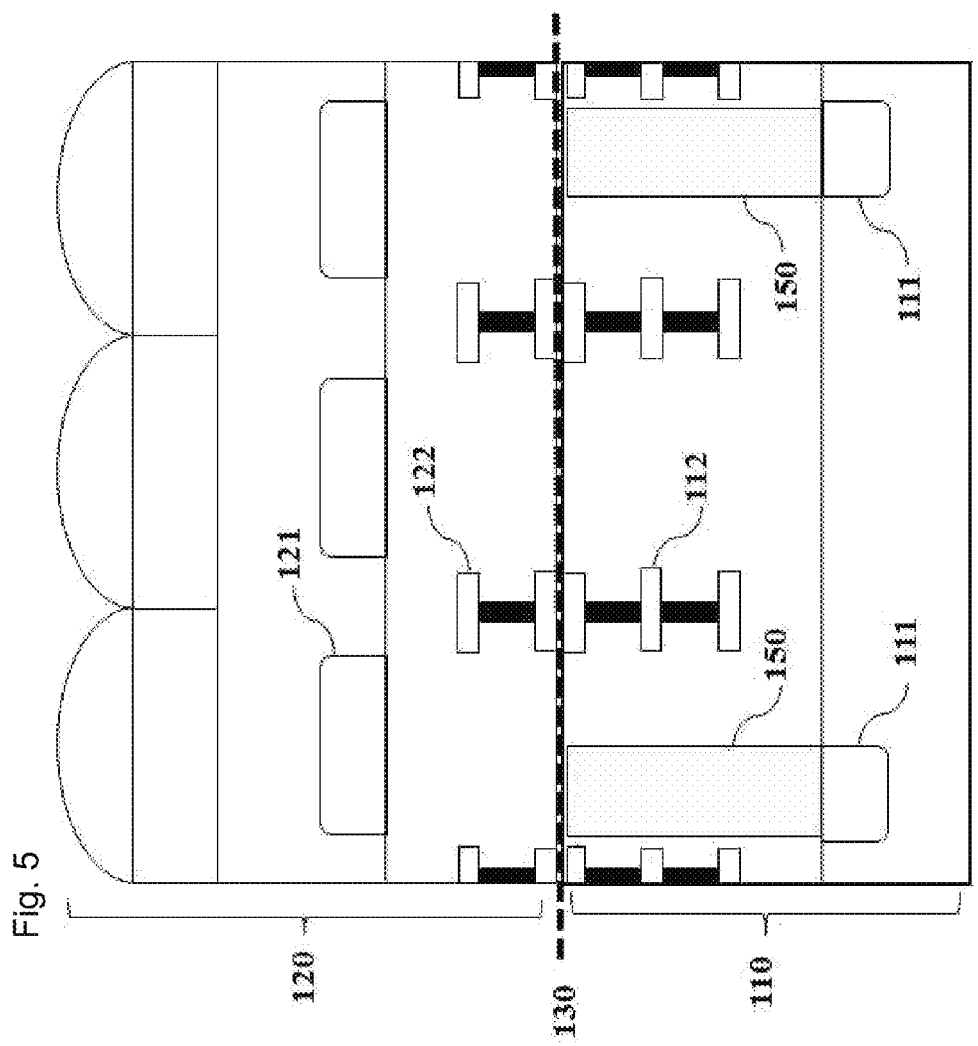
FIG. 5 is a diagram illustrating further another embodiment of an image sensor with a 3D stack structure according to the present invention.

FIG. 5 is a diagram illustrating further another embodiment of the image sensor with a 3D stack structure according to the present invention.

Referring to FIG. 5, it can be understood that the size of the first photodiode 111 is smaller than the size of the second photodiode 121, and the light waveguide 150 is formed at an upper portion of the first photodiode 111 such that light is more sensitively transferred to the first photodiode 111.

Figure 6:
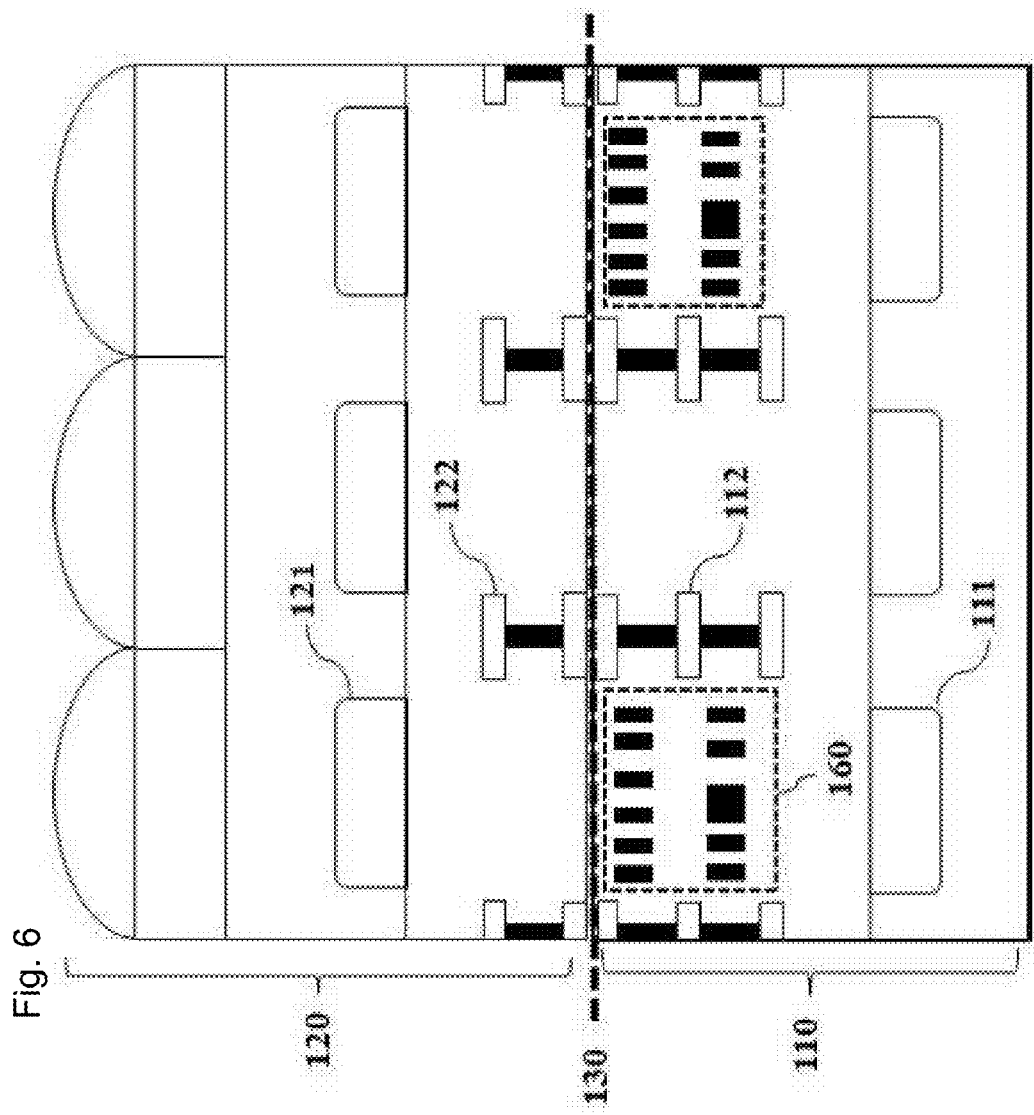
FIG. 6 is a diagram illustrating further another embodiment of an image sensor with a 3D stack structure according to the present invention.

FIG. 6 is a diagram illustrating further another embodiment of the image sensor with a 3D stack structure according to the present invention.

Referring to FIG. 6, it can be understood that in order to realize the phase difference AF function, a Talbot effect induction filter 160 is formed at an upper portion of the first photodiode 111 in the first substrate 110 to induce a Talbot effect.

A pattern of the Talbot effect induction filter 160 may be variously changed and implemented in the range in which the phase difference AF function can be realized.

Figure 7:
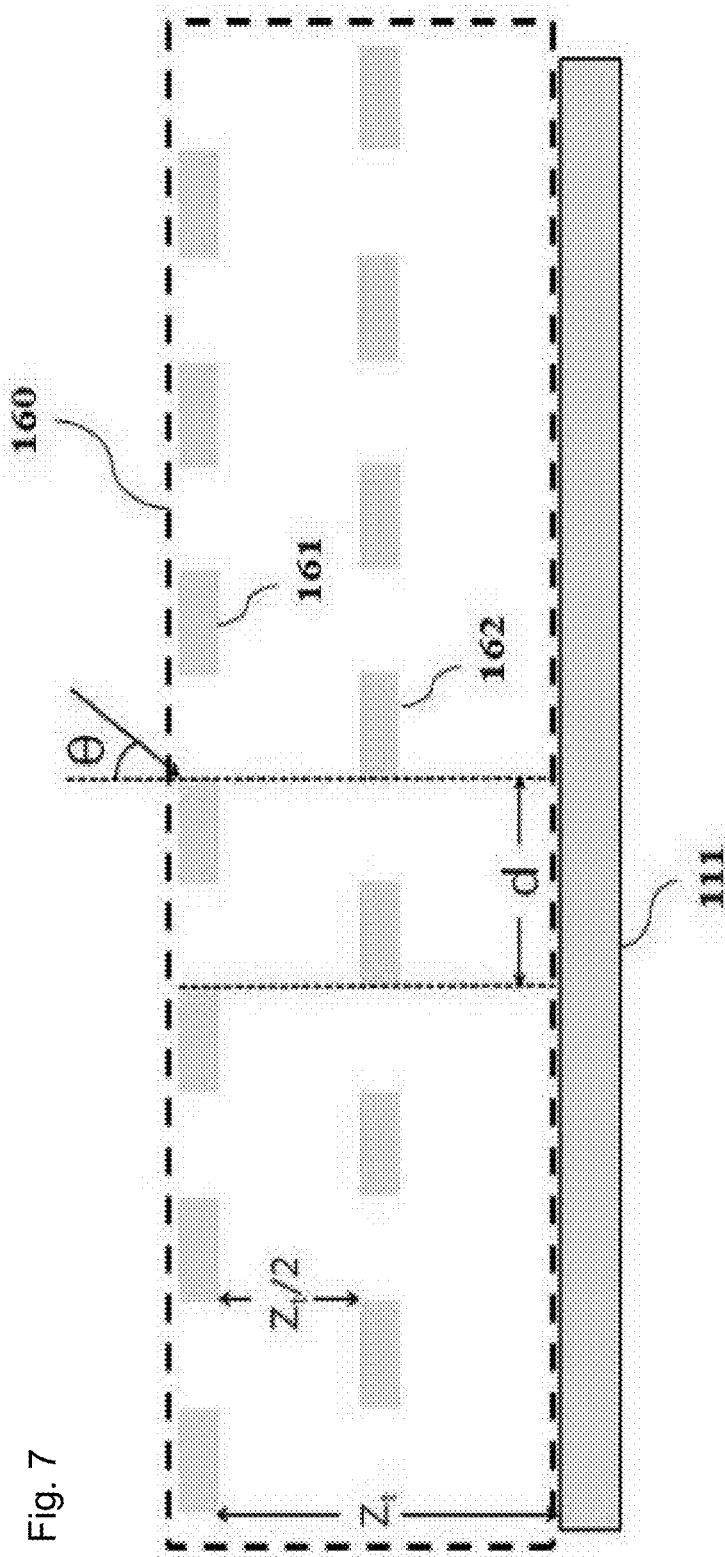
FIG. 7 is a diagram for explaining a Talbot effect.
Figure 8:
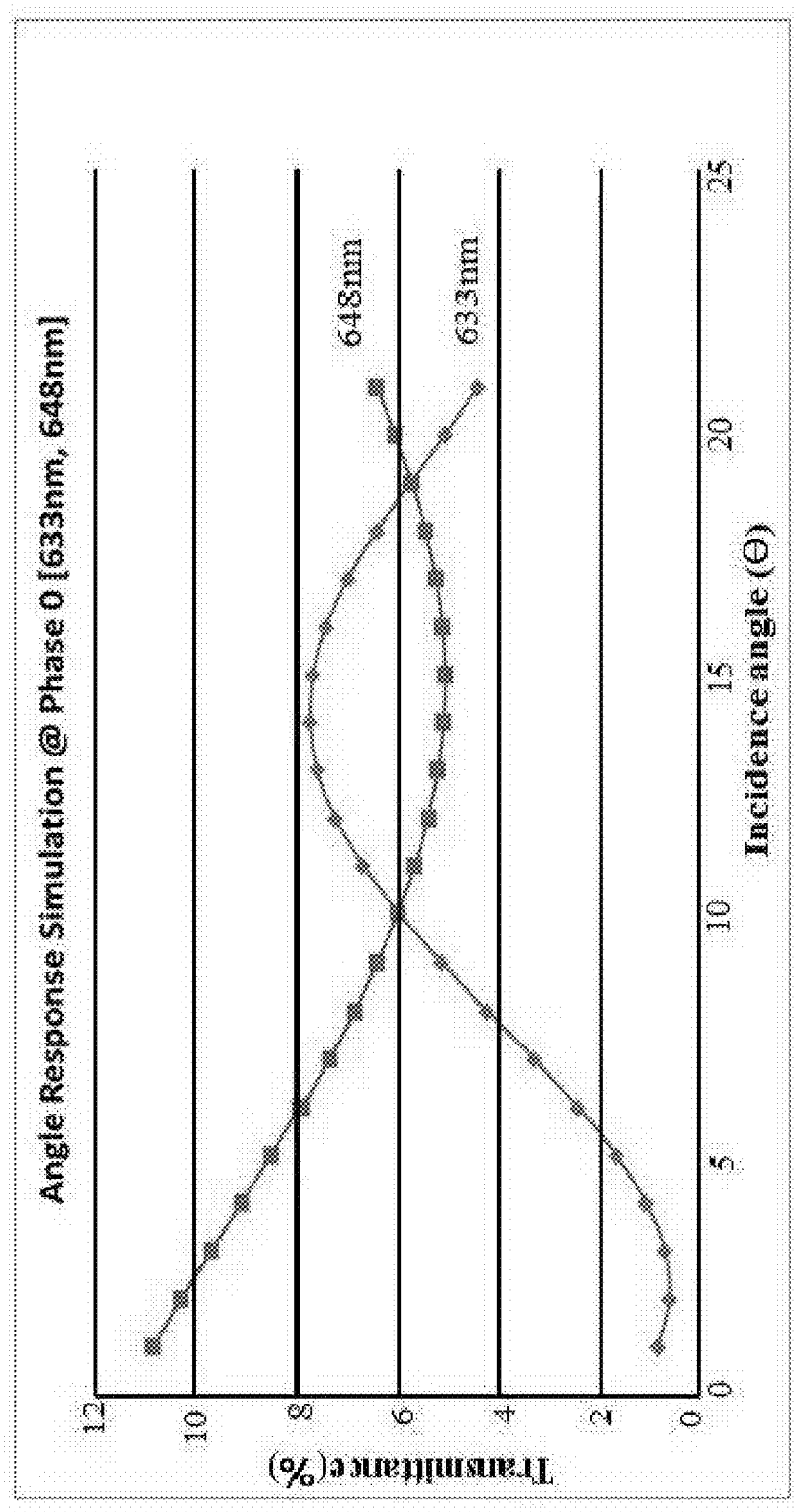
FIG. 8 is a diagram a result obtained by simulating reactions according to angles by using a Talbot effect induction filter.

FIG. 7 is a diagram for explaining the Talbot effect, and FIG. 8 is a diagram a result obtained by simulating reactions according to angles by using the Talbot effect induction filter.

The Talbot effect means a phenomenon that an image of a diffraction grid is repeated after a lattice plane when light crosses by a plane wave. FIG. 7 is an embodiment of the Talbot effect induction filter 160, wherein the Talbot effect induction filter 160 includes a first plate 161 and a second plate 162, and a distance $Z_T$ between the first plate 161 and the first photodiode 111 may be allowed to be twice as long as a distance $Z_T/2$ between the first plate 161 and the second plate 162.

The first plate 161 is formed at an upper portion and includes a plurality of slits with a pitch d. The second plate 162 is formed at a sensor unit, that is, at the side of the first photodiode 111 of the present invention, and includes a plurality of slits with a pitch d. FIG. 7 illustrates the pitch of the first plate 161 is equal to the pitch of the second plate 162, but it is of course that the pitches may be formed to be different from each other.

At this time, a wavelength of light having passed through the first plate 161 and the second plate 162 is decided by the distance $Z_T$ between the first plate 161 and the first photodiode 111 and the pitch d of the slit.

The present invention uses the Talbot effect meaning a phenomenon that light having passed through the slit of the first plate 161 after being incident into the first plate 161 passes the slit of the second plate 162 due to a diffraction phenomenon, and light diffracted to a part other than an opened slit does not pass through the second plate 162 and is finally blocked.

When the pitch of the slit is d and a wavelength of incident light is λ, the distance $Z_T$ in which the Talbot effect occurs may be expressed by the following Equation 1.

$$Z_T = 2d^2/\lambda \qquad \text{Equation 1}$$

FIG. 8 illustrates a simulation result obtained by combining the Talbot effect induction filter 160 with a sensor and detecting a light emitting wavelength and an excited wavelength of a fluorescent material according to angles, wherein it can be understood that transmittance is low at an angle of 0° to 3° when the excited wavelength is 633 nm, but transmittance is about ten times as high as that in the excited wavelength at the same angle when the light emitting wavelength is 648 nm.

Using such a result, an optimal incident angle θ is set, so that it is possible to adjust light incident into the first photodiode.

As described above, in accordance with the image sensor with a 3D stack structure according to the present invention, a problem of the reduction of resolution, which is a disadvantage of the existing imaging surface phase difference AF device, is solved, so that it is possible to realize a fast phase difference AF while maintaining high resolution without a separate phase difference AF module.

Furthermore, in accordance with the image sensor with a 3D stack structure according to the present invention, a phase difference AF function is realized in a smart phone according to situations, so that fact capturing is possible.

Moreover, it is advantageous that the image sensor with a 3D stack structure according to the present invention is variously applied to distance measurement between objects or three dimensional image capturing as well as the simple realization of a phase difference AF function.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An image sensor with a 3D stack structure, comprising:
   a first substrate including a first photodiode; and
   a second substrate including a second photodiode and stacked at an upper portion of the first substrate,
   wherein a part of light incident into the first photodiode is blocked to realize a phase difference AF function.

2. The image sensor with a 3D stack structure according to claim 1, wherein a size of the first photodiode is smaller than a size of the second photodiode.

3. The image sensor with a 3D stack structure according to claim 1, wherein a metal interconnection is formed at an upper portion of the first photodiode such that light is prevented from being incident into a part of the first photodiode.

4. The image sensor with a 3D stack structure according to claim 1, wherein a blocking layer is formed on a bonding surface between the first substrate and the second substrate such that light is prevented from being incident into a part of the first photodiode.

5. The image sensor with a 3D stack structure according to claim 4, wherein the blocking layer includes a black material.

6. The image sensor with a 3D stack structure according to claim 1, wherein a light waveguide is formed at an upper portion of a part at which light is incident into the first photodiode.

7. The image sensor with a 3D stack structure according to claim 4, wherein a light waveguide is formed at an upper portion of a part at which light is incident into the first photodiode.

8. The image sensor with a 3D stack structure according to claim 1, wherein a Talbot effect induction filter is formed at an upper portion of the first photodiode.

9. The image sensor with a 3D stack structure according to claim 1, wherein distance measurement between objects or three dimensional image capturing is possible.

10. The image sensor with a 3D stack structure according to claim 2, wherein a blocking layer is formed on a bonding surface between the first substrate and the second substrate such that light is prevented from being incident into a part of the first photodiode.

11. The image sensor with a 3D stack structure according to claim 10, wherein the blocking layer includes a black material.

12. The image sensor with a 3D stack structure according to claim 10, wherein a light waveguide is formed at an upper portion of a part at which light is incident into the first photodiode.

13. The image sensor with a 3D stack structure according to claim 2, wherein a light waveguide is formed at an upper portion of a part at which light is incident into the first photodiode.

* * * * *